United States Patent
Malinen et al.

(10) Patent No.: US 10,619,241 B2
(45) Date of Patent: Apr. 14, 2020

(54) ALD METHOD AND APPARATUS

(71) Applicant: Picosun Oy, Espoo (FI)

(72) Inventors: Timo Malinen, Espoo (FI); Juhana Kostamo, Espoo (FI); Wei-Min Li, Espoo (FI); Tero Pilvi, Helsinki (FI)

(73) Assignee: Picosun Oy, Espoo (FI)

( * ) Notice: Subject to any disclaimer, the term of this patent is extended or adjusted under 35 U.S.C. 154(b) by 0 days.

(21) Appl. No.: 15/536,943

(22) PCT Filed: Nov. 25, 2015

(86) PCT No.: PCT/FI2015/050819
§ 371 (c)(1),
(2) Date: Jun. 16, 2017

(87) PCT Pub. No.: WO2016/102748
PCT Pub. Date: Jun. 30, 2016

(65) Prior Publication Data
US 2017/0342560 A1    Nov. 30, 2017

(30) Foreign Application Priority Data

Dec. 22, 2014 (FI) .................. 20140361

(51) Int. Cl.
*C23C 16/455* (2006.01)
*C23C 16/48* (2006.01)

(52) U.S. Cl.
CPC .. *C23C 16/45527* (2013.01); *C23C 16/45536* (2013.01); *C23C 16/45574* (2013.01);
(Continued)

(58) Field of Classification Search
CPC ............. C23C 16/06; C23C 16/45525; C23C 16/45536; C23C 16/45542
See application file for complete search history.

(56) References Cited

U.S. PATENT DOCUMENTS 6,767,582 B1 * 7/2004 Elers ............... C23C 16/32
427/253
8,465,811 B2 * 6/2013 Ueda ............... C23C 16/325
427/569
(Continued)

FOREIGN PATENT DOCUMENTS

CN    103890910 A    6/2014
JP    2005-310927 A    11/2005
(Continued)

OTHER PUBLICATIONS

Mameli, Alfredo, et al., "Area-Selective Atomic Layer Deposition of $In_2O_3$:H Using a u-Plasma Printer for Local Area Activation". Chemistry of Materials, 2017, 29, 921-925.*
(Continued)

*Primary Examiner* — Bret P Chen
(74) *Attorney, Agent, or Firm* — Ziegler IP Law Group, LLC

(57) ABSTRACT

A method that includes performing an atomic layer deposition sequence including at least one deposition cycle, each cycle producing a monolayer of deposited material, the deposition cycle including introducing at least a first precursor species and a second precursor species to a substrate surface in a reaction chamber, wherein both of said first and second precursor species are present in gas phase in said reaction chamber simultaneously.

16 Claims, 8 Drawing Sheets

US 10,619,241 B2
Page 2

(52) U.S. Cl.
CPC ........ *C23C 16/45578* (2013.01); *C23C 16/48* (2013.01); *C23C 16/482* (2013.01); *C23C 16/483* (2013.01)

(56) References Cited

U.S. PATENT DOCUMENTS

| | | | |
|---|---|---|---|
| 10,043,880 B2 | 8/2018 | Pore et al. | |
| 2002/0001974 A1 | 1/2002 | Chan et al. | |
| 2003/0143841 A1 | 7/2003 | Yang et al. | |
| 2004/0053496 A1 | 3/2004 | Choi | |
| 2004/0071897 A1* | 4/2004 | Verplancken | C23C 16/452 427/569 |
| 2005/0221021 A1 | 10/2005 | Strang | |
| 2005/0223968 A1* | 10/2005 | Randall | C30B 25/04 117/94 |
| 2005/0284370 A1* | 12/2005 | Strang | C23C 16/402 118/715 |
| 2006/0214305 A1 | 9/2006 | Sakata et al. | |
| 2007/0128704 A1 | 6/2007 | Sturmer | |
| 2010/0124621 A1* | 5/2010 | Kobayashi | C23C 16/325 427/579 |
| 2011/0256726 A1 | 10/2011 | Lavoie et al. | |
| 2011/0300716 A1 | 12/2011 | Park et al. | |
| 2012/0009802 A1 | 1/2012 | LaVoie et al. | |
| 2012/0028454 A1* | 2/2012 | Swaminathan | C23C 16/045 438/558 |
| 2012/0088369 A1* | 4/2012 | Weidman | G03F 7/0752 438/703 |
| 2013/0042811 A1 | 2/2013 | Shanker et al. | |
| 2013/0115768 A1* | 5/2013 | Pore | H01L 21/76886 438/664 |
| 2013/0280860 A1 | 10/2013 | Tellez Oliva | |
| 2015/0292085 A1 | 10/2015 | Baisl et al. | |

FOREIGN PATENT DOCUMENTS

| | | |
|---|---|---|
| JP | 2006-229207 A | 8/2006 |
| JP | 2013-211551 A | 10/2013 |
| TW | 201303062 A1 | 1/2013 |
| WO | 2009/130375 A1 | 10/2009 |
| WO | 2012013824 A1 | 2/2012 |
| WO | 2012051485 A1 | 4/2012 |
| WO | 2012136875 A1 | 10/2012 |
| WO | 2013043330 A1 | 3/2013 |
| WO | 2013/112727 A1 | 8/2013 |
| WO | 2014076276 A1 | 5/2014 |

OTHER PUBLICATIONS

Elers, Kai-Erik, et al., "Film Uniformity in Atomic Layer Deposition". Chemical Vapor Deposition, 2006, 12, 13-24.*
Kwon, Oh-Kyum, et al., "Atomic Layer Deposition of Ruthenium Glue Layer for Copper Damascene Interconnect". Abstract only. p. 1 No citation or date information available.*
Extended European Search Report received for European Patent Application No. EP15872018.5, dated Dec. 14, 2017, 7 pages.
Maydannik Philip S et al. "Roll-to-roll atomic layer deposition process for flexible electronics encapsulation applications", Journal of Vacuum Science and Technology, A (Vacuum, Surfaces, and Films) 32(5) Sep./Oct. 2014, 7 pages.
International Search Report, Application No. PCT/FI2015/050819, dated Feb. 26, 2016, 7 pages.
Written Opinion of the International Searching Authority, Application No. PCT/FI2015/050819, dated Feb. 26, 2016, 9 pages.
Finnish Patent and Registration Office Search Report, Application No. 20140361, dated Jul. 6, 2015, 1 page.
The Patent Office of the People's Republic of China, Notification of the First Office Action, Application No. 201580069868X, dated Jan. 18, 2019, 7 pages, 2 pages of English translation.
The Patent Office of the People's Republic of China, Search Report, Application No. 201580069868X, dated Jan. 14, 2019, 2 pages.
Finnish Patent and Registration Office, Office Action of Patent Application No. 20140361 dated Oct. 4, 2016, 4 pages.
International Preliminary Report on Patentability of International Application No. PCT/FI2015/050819 dated Jun. 27, 2017, 10 pages.
Communication Pursuant to Rules 70(2) and 70a(2) EPC of European Patent Application No. EP15872018.5 dated Jan. 8, 2018, 1 page.
Intellectual Property Office of Singapore Examination Report of Patent Application No. SG11201703665W dated Feb. 4, 2019, 4 pages.
Russian Search Report of Patent Application No. 2017124639 dated Apr. 23, 2019.
Taiwan Search Report of Patent Application No. 104140939 dated May 31, 2019, 1 page.
Notification of Ground of Rejection received for Japanese Patent Application JP2017-529021, dated Aug. 27, 2019, 9 pages including the 5 pages of English translation.

* cited by examiner

ALD METHOD AND APPARATUS

FIELD

The aspects of the disclosed embodiment generally relate to atomic layer deposition (ALD) type of techniques.

BACKGROUND

This section illustrates useful background information without admission of any technique described herein representative of the state of the art.

Atomic Layer Deposition (ALD) is a special chemical deposition method based on sequential introduction of at least two reactive precursor species to at least one substrate in a reaction space. The growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase.

An ALD deposition cycle consists of four sequential steps: pulse A, purge A, pulse B, and purge B. Pulse A consists of metal precursor vapor and pulse B of non-metal precursor vapor. Inactive gas, such as nitrogen or argon, and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film of desired thickness.

Precursor species form through chemisorption a chemical bond to reactive sites of substrate surface. No more than a molecular monolayer of a solid material forms on the surface during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorp on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is followed by a first purge step (purge A) wherein the excess first precursor and possible reaction by-products are removed from the reaction space. Second precursor vapor is then introduced into the reaction space. Second precursor molecules react with the adsorbed species of the first precursor molecules, thereby forming the desired thin film material. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film has grown to a desired thickness.

Thin films grown by ALD are dense, pinhole free and have uniform thickness. For example, in an experiment aluminum oxide has been grown by ALD from trimethyl-aluminum $(CH_3)_3Al$, also referred to as TMA, and water resulting in only about 1% non-uniformity over a substrate wafer.

SUMMARY

According to a first example aspect of the disclosed embodiments there is provided a method, comprising:
performing an atomic layer deposition sequence comprising at least one deposition cycle, each cycle producing a monolayer of deposited material, the deposition cycle comprising introducing at least a first precursor species and a second precursor species to a substrate surface in a reaction chamber, wherein both of said first and second precursor species are present in gas phase in said reaction chamber simultaneously.

In certain example embodiments, the deposition cycle comprises an activation period and a regeneration period, and in the method:
during the activation period, the second precursor species reacts with the first precursor species adsorbed to the substrate surface in a preceding regeneration period; and
during a subsequent regeneration period, the first precursor species reacts with the second precursor species adsorbed to the surface in the activation period.

A deposition cycle may be considered to begin with the regeneration period or with the activation period. The first deposition cycle may begin with a regeneration period during which the first precursor reacts with the substrate surface. The activation period then immediately follows the regeneration period. The regeneration period produces half a monolayer of deposited material. And, the activation period produces the remaining half of a monolayer of deposited material.

The first and second precursor species may be selected so that they are inert with respect to each other in gas phase in normal process conditions, i.e., in the processing temperature without activation. They can be present in a same volume within the reaction chamber (mixed with each other). In certain example embodiments, the second precursor species is inert towards the adsorbed first precursor species without activation whereas the first precursor species is reactive, also without activation, with the second precursor species adsorbed to the surface.

In certain example embodiments, alternately the second precursor species reacts with the adsorbed species of the first precursor and the first precursor species reacts with the adsorbed species of the second precursor by chemisorption.

The reactions may be sequential self-saturating surface reactions.

In certain example embodiment, one of the first or second precursor species is excited by photon energy during the activation period. In certain example embodiments, the periods of activation and regeneration alternate, wherein activation (or excitation) occurs only during the activation period. The activation may be implemented by photons emitted by a photon source, such as an UV lamp, a LED lamp, a xenon lamp, an X-ray source, a laser source, or an infrared source.

In certain example embodiments, the method comprises exciting the first precursor species adsorbed to the substrate surface, whereby the adsorbed first precursor species reacts on the surface with the second precursor species which is in gas phase.

In certain example embodiments, alternatively, the method comprises exciting second precursor species in gas phase, whereby the excited second precursor species reacts on the surface with the adsorbed first precursor species.

In certain example embodiments, the first precursor species reacts during the regeneration period, without activation (i.e., without excitation), with the second precursor species adsorbed to the surface.

The first precursor can be a metal precursor and the second precursor a non-metal precursor.

Then, for example, the non-metal precursor in gas phase can be excited by photon energy in the proximity of the substrate surface, or the metal precursor adsorbed to the surface can be excited during the activation period.

In certain other embodiments, both precursor species are non-metal precursor species. Examples of coating materials are, for example, metals, oxides, and nitrides.

In certain example embodiments, the deposition cycles are performed by skipping purge periods, i.e., without performing purge periods.

In certain example embodiments, the number of precursor species is more than two. In these embodiments, one of the precursors may be reactive with the surface without excitation the other precursors being inert towards surface reactions without excitation.

The method in accordance with the first example aspect and its embodiment can be used for a plurality of different applications, for example, for coating any applicable stationary or a moving substrate. The substrate may be, for example, a plate-like object, such as silicon wafer, a glass plate, a metal foil. The substrate may be a substrate web, a strand or a strip. The substrate may be a thin flexible glass substrate. It may be a polymer. It may be a fibrous web of paper, board or nanocellulose. It may be a solar cell, an OLED display, a printed circuit board component or generally a component of electronics. The method can be used for low temperature passivation of heat sensitive applications.

According to a second example aspect of the disclosed embodiments there is provided an apparatus, comprising:
a reaction chamber;
at least one in-feed line; and
a control system configured to control the apparatus to perform an atomic layer deposition sequence comprising at least one deposition cycle in the reaction chamber, each cycle producing a monolayer of deposited material, the deposition cycle comprising introducing at least a first precursor species and a second precursor species via said at least one in-feed line to a substrate surface in the reaction chamber, wherein
the control system is further configured to control that precursor vapor of both of said first and second precursor species is present in gas phase in said reaction chamber simultaneously.

In certain example embodiments, the deposition cycle comprises an activation period and a regeneration period, and the apparatus is configured to cause:
during the activation period, the second precursor species to react with the first precursor species adsorbed to the substrate surface in a preceding regeneration period; and
during a subsequent regeneration period, the first precursor species to react with the second precursor species adsorbed to the surface in the activation period.

In certain example embodiments, the apparatus comprises a photon source to excite one of the first or second precursor species by photon energy during the activation period.

In certain example embodiments, the apparatus is configured to cause: exciting the first precursor species adsorbed to the substrate surface, whereby the adsorbed first precursor species reacts on the surface with the second precursor species which is in gas phase.

In certain example embodiments, the apparatus is configured to cause: exciting the second precursor species in gas phase, whereby the excited second precursor species reacts on the surface with the adsorbed first precursor species.

In certain example embodiments, the reactions are sequential self-saturating surface reactions.

In certain example embodiments, the first precursor is a metal precursor and the second precursor a non-metal precursor.

In certain example embodiments, the control system is configured control that the deposition cycles are performed without performing purge periods.

Different non-binding example aspects and embodiments of the present disclosure have been illustrated in the foregoing. The above embodiments are used merely to explain selected aspects or steps that may be utilized in implementations of the subject of the present disclosure. Some embodiments may be presented only with reference to certain example aspects of the present disclosure. It should be appreciated that corresponding embodiments may apply to other example aspects as well. Any appropriate combinations of the embodiments may be formed.

BRIEF DESCRIPTION OF THE DRAWINGS

The disclosed embodiments will now be described, by way of example only, with reference to the accompanying drawings, in which.

DETAILED DESCRIPTION

The basics of an ALD growth mechanism are known to a skilled person. As mentioned in the introductory portion of this patent application, ALD is a special chemical deposition method based on the sequential introduction of at least two reactive precursor species to at least one substrate. A basic ALD deposition cycle consists of four sequential steps: pulse A, purge A, pulse B and purge B. Pulse A consists of a first precursor vapor and pulse B of another precursor vapor. The following presents a deviation to the basic deposition cycle thinking.

Figure 1:
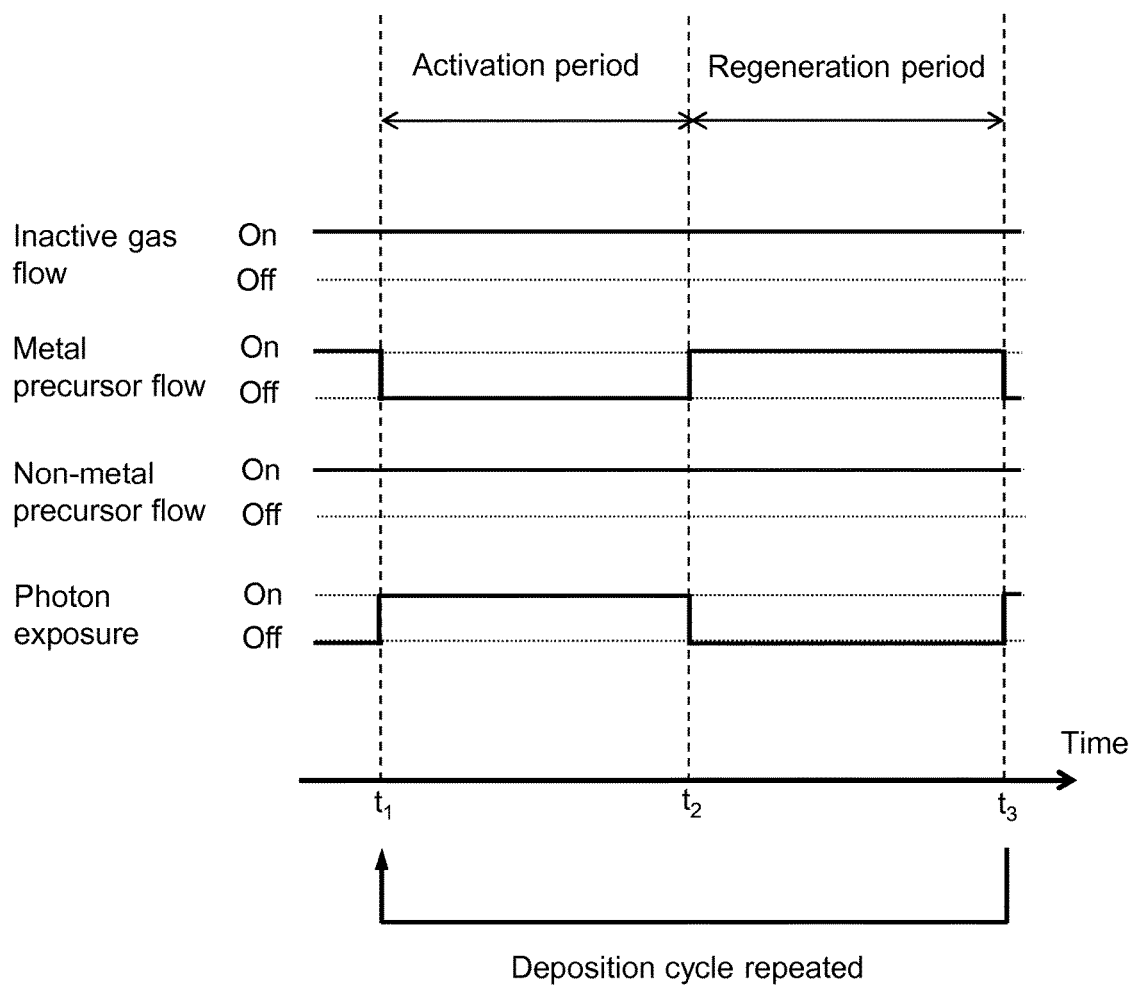
FIG. 1 shows an example timing diagram in accordance with an example embodiment.

FIG. 1 shows an example timing diagram of a method in accordance with an example embodiment. An atomic layer deposition sequence comprising at least one deposition cycle is performed where each cycle produces a monolayer of deposited material. The deposition cycle comprises introducing a first precursor species and a second precursor species to a substrate surface in a reaction chamber, wherein both of said first and second precursor species are present in gas phase in said reaction chamber simultaneously.

In this example, the first precursor species is a metal precursor and the second precursor species is a non-metal precursor. The first and second precursor species are inactive with respect to each other in gas phase.

The method comprises alternating an activation period (from time instant $t_1$ to $t_2$) and a regeneration period (from time instant $t_2$ to $t_3$). As demonstrated in FIG. 1, during the activation period the metal precursor flow to the reaction chamber is off. The substrate surface has been saturated by the metal precursor species in a previous regeneration period. The non-metal precursor flow to the reaction chamber is on. However, the non-metal precursor has been selected so that it does not react with the metal precursor on the substrate surface without additional excitation (additional meaning herein energy additional to the thermal energy prevailing in the reaction chamber).

The non-metal precursor species in the proximity of the substrate surface is excited by exposing it to photon energy during the activation period. This gives the non-metal precursor species the additional energy required to react with the metal precursor species adsorbed to the substrate surface. As a result, the substrate surface becomes saturated by the non-metal precursor species.

Alternatively, the metal precursor species on the substrate surface is excited by exposing it to photon energy during the activation period. This gives the additional energy required to the reaction between metal precursor species adsorbed to the substrate surface and the gas phase non-metal precursor species. As a result, the substrate surface becomes saturated by the non-metal precursor species.

The alternative which is desired to be used for excitation may be selected by adjusting the wavelength of the photons (i.e., light/radiation).

During the immediately following regeneration phase, both the non-metal precursor flow and metal precursor flow are on and the photon exposure is off. Both the first precursor vapor (metal precursor) and the second precursor vapor (non-metal precursor) are present in gas phase in the reaction chamber simultaneously. The photon exposure can be switched off by a shader.

The metal precursor species reacts with the non-metal precursor species which were adsorbed to the surface in the activation period. Although present, the non-metal precursor species do not react with the substrate surface since the photon exposure is off. As a result, the substrate surface becomes saturated by the metal precursor species.

These deposition cycles are repeated to achieve a desired thickness. Conventional purge periods can be skipped therefore achieving a faster ALD growth rate.

During the regeneration period, an inactive gas flow is used as a carrier gas flow for the metal precursor. However, the inactive gas flow to the reaction chamber can be on also during the activation period.

The reaction mechanism during both the activation period and regeneration period is chemisorption. The reactions may be self-saturating surface reactions.

Figure 2:
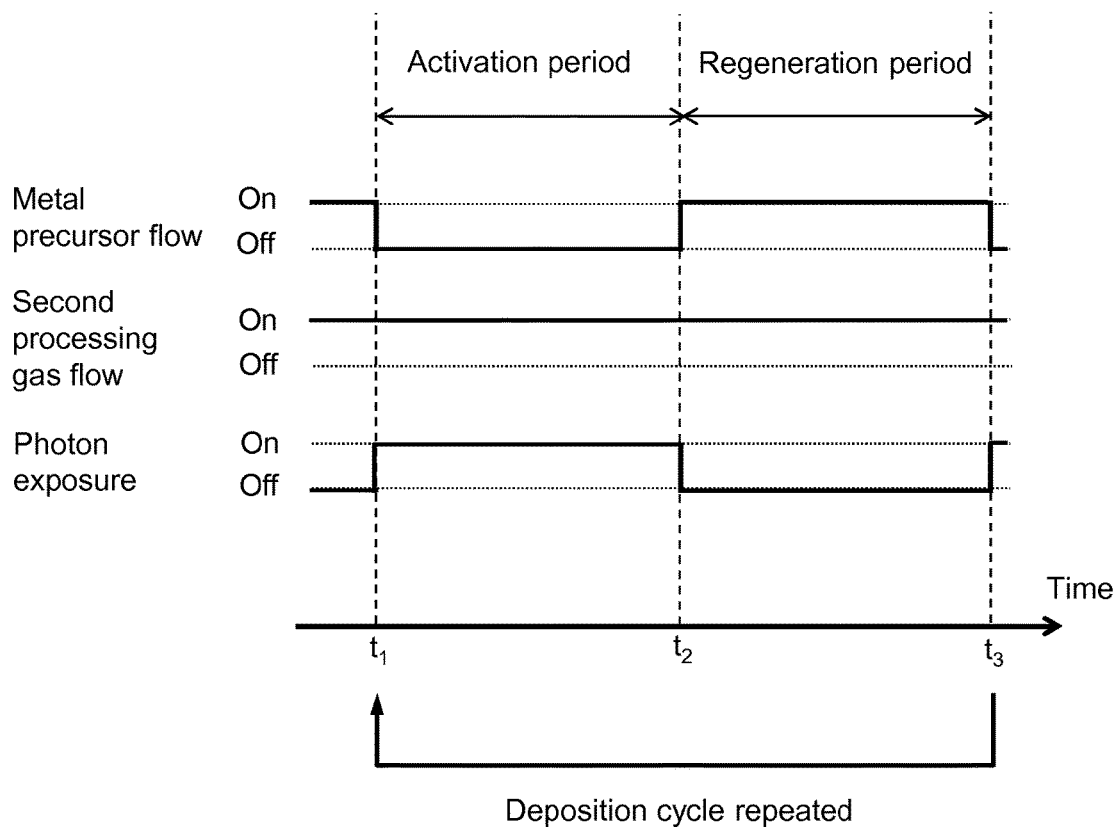
FIG. 2 shows an example timing diagram in accordance with another example embodiment.

The inactive gas used as carrier gas is either the same gas or different gas than the non-metal precursor source gas. In certain example embodiments, as shown in FIG. 2, the same gas (herein denoted as second processing gas) is used as both carrier gas and as non-metal precursor source gas. The flow of the second processing gas into the reaction chamber is kept on during the whole deposition cycle. In these embodiments, the second processing gas functions as carrier gas during the regeneration period and as non-metal precursor source gas during the activation period. Both the first precursor species (metal precursor) and the second precursor species (non-metal precursor) are present in gas phase in the reaction chamber simultaneously. In an example embodiment, trimethylaluminium (TMA, $(CH_3)_3Al$) is used as the metal precursor and oxygen ($O_2$) as the second processing gas. Then during the activation period, oxygen is excited to oxygen radicals O*, and surface reactions take place between O* radicals and adsorbed TMA to form the desired coating material, aluminium oxide ($Al_2O_3$). In certain other embodiments, both precursor species are non-metal precursor species. Examples of coating materials are, for example, metals, oxides, and nitrides.

Figure 3:
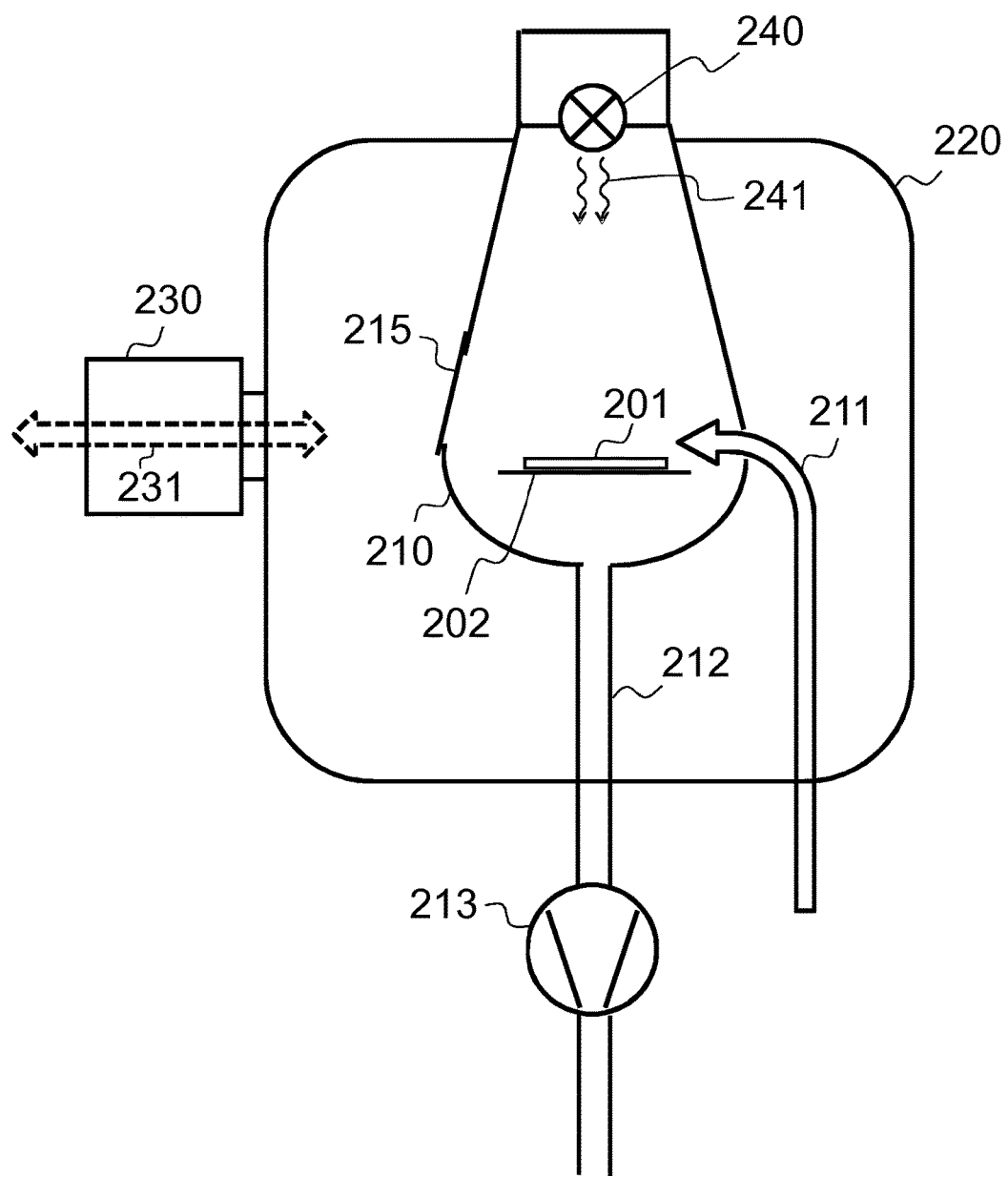
FIG. 3 shows a side view of an example apparatus in accordance with an example embodiment.

FIG. 3 shows a side view of an example apparatus in accordance with an example embodiment. The apparatus can be an atomic layer deposition reactor. The apparatus comprises a reaction chamber 210 which is surrounded by an outer chamber 220. The reaction chamber 210 can optionally have walls which define an expansion space widening downwards as depicted in FIG. 3. The intermediate space between the outer chamber 220 and the reaction chamber 210 is pressurized by conveying inactive gas to the space so that there is a slight overpressure compared to the interior of the reaction chamber 210.

Figure 4:
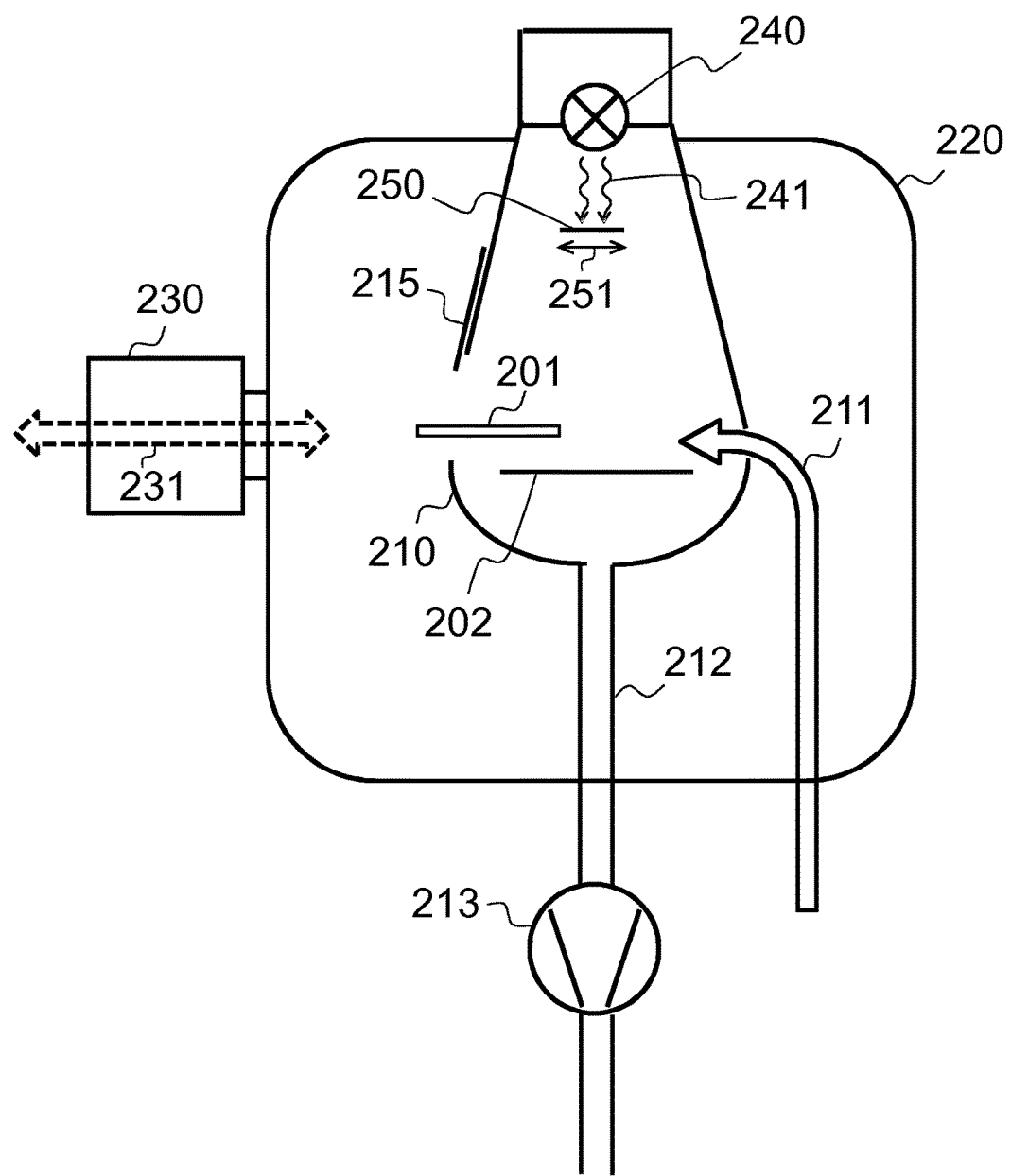
FIG. 4 shows loading and unloading in the apparatus of FIG. 3.

A substrate holder 202 supports a substrate 201 in the reaction chamber 210. The substrate 201 can be loaded into and unloaded from the reaction chamber 210 (as depicted by arrow 231) via a substrate transfer chamber 230 attached to the outer chamber 220. The reaction chamber 210 comprises a movable structure, such as a door 215, and the loading and unloading is performed the door 215 in an open position as depicted in FIG. 4. Alternatively, the movable structure can be formed by two (or more) nested sub-parts or ring-like members which fit within each other, one of said sub-parts or ring-like members being vertically movable to enable loading and unloading via an aperture thus formed.

Returning back to FIG. 3, the apparatus comprises at least one precursor vapor in-feed line 211 to convey precursor vapor to the reaction chamber 210. The apparatus further comprises a vacuum pump 213 in an evacuation line 212 for maintaining an outgoing flow from the reaction chamber 210.

The apparatus comprises a photon source 240 above the substrate surface. The photon source 240 can be an UV lamp, a LED lamp or, for example, an X-ray source, a laser source, or an infrared source. It provides photon exposure by emitting photons 241. The photon source 240 in an example embodiment operates in a flashing manner. Photons 241 are emitted during the activation period, and photons 241 are not emitted during the regeneration period. As a result the photon exposure is on during the activation period and off during the regeneration period. In an alternative embodiment, the photon source 240 is on all the time (and emits photons 241). In such an embodiment, photon exposure can be controlled by a shader (mask) applied between the photon source 240 and substrate surface. FIG. 4 shows such an example shader 250. The photon exposure is provided to the areas on the substrate surface which see the photon source 240 behind the shader 250. The activation period and the resulting deposition (material growth) thus occurs only on these areas. The shader 250 can be stationary leading to selective deposition only on certain areas on the surface (if the shader 250 is stationary, photon exposure can be switched on and off, e.g., by flashing the photon source 240). Or, it can be movable (as depicted by arrow 251) to shift the exposed area on the substrate surface (or to shade the substrate area altogether during the regeneration period in an embodiment).

Figure 5:
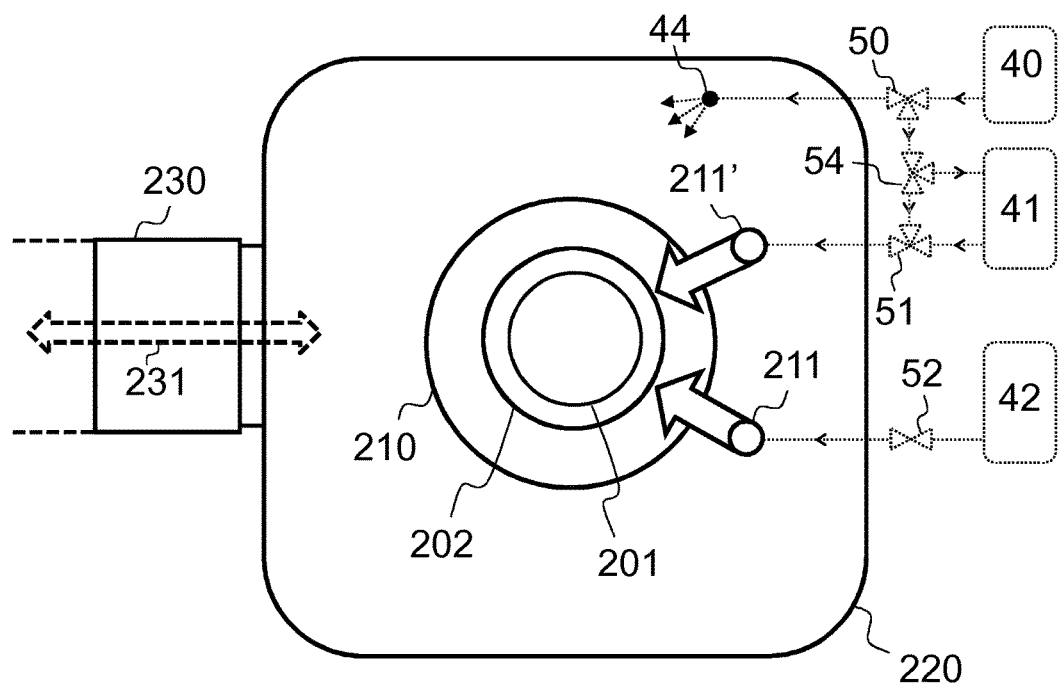
FIG. 5 shows a top view of the apparatus of FIGS. 3 and 4.

FIG. 5 shows a top view of the apparatus of FIGS. 3 and 4 compatible with the method shown in FIG. 1. The non-metal precursor species flows into the reaction chamber 210 via the infeed-line 211 and the metal precursor species together with inactive carrier gas via the in-feed line 211'.

The apparatus comprises an inactive gas source 40, a metal precursor source 41 and a non-metal precursor source 42. The inactive gas source 40 is in fluid communication with the input of an inactive gas line valve 50. A first output of valve 50 leads into the intermediate space between the outer chamber 220 and the reaction chamber 210 where inactive gas is released to the intermediate space via a gas release point 44. A second output of valve 50 is in fluid communication with the input of a carrier gas input valve 54. A first output of valve 54 is in fluid communication with a carrier gas input of the metal precursor source 41. A second output of valve 54 is in fluid communication with a second input of a metal precursor line valve 51. The metal precursor source 41 is in fluid communication with a first input of valve 51. The output of valve 51 continues as the in-feed line 211'. The non-metal precursor source is in fluid communication with the input of a non-metal precursor line valve 52. The output of valve 52 continues as the in-feed line 211.

During the activation phase, the first input of the metal precursor line valve 51 is closed. Accordingly, the metal precursor species does not flow into the reaction chamber 210. The non-metal precursor line valve 52 is open allowing the non-metal precursor species to flow into the reaction chamber 210 via in-feed line 211. A route from the inactive gas source 40 to the reaction chamber 210 via in-feed line 211' is kept open or closed depending on the implementation. The non-metal precursor species in the proximity of the substrate surface on the area which see the photon source 240 (i.e., which are not in the shade of the shader 250) is excited. Alternatively, the metal precursor species on the substrate surface is excited. In both alternatives the excitation enables the reaction between the adsorbed metal precursor species and the gas phase non-metal precursor species. As a result, the substrate surface on said area becomes saturated by the non-metal precursor species. If desired, it can be arranged by the shader 250, that the whole substrate surface or only part of it becomes saturated.

During the regeneration phase, the first input and the output of the metal precursor line valve 51 are open allowing the metal precursor species to flow into the reaction chamber 210 via in-feed line 211'. The non-metal precursor line valve 52 is open allowing the non-metal precursor species to flow into the reaction chamber 210 via in-feed line 211. The photon exposure is switched off by the shader 250, or by not sending photons in the embodiment that uses the flashing photon source. The metal precursor species reacts with the non-metal precursor species which were adsorbed to the surface in the activation period. As a result, the substrate surface becomes saturated by the metal precursor species on the area of the adsorbed non-metal precursor species.

As the non-metal precursor species is always present in the reaction chamber 210 the following activation period may commence immediately when the photon exposure is, again, switched on. In an example embodiment, the photon source 240 is always on and the photon exposure on the substrate surface is adjusted merely by moving the shader 250.

Figure 6:
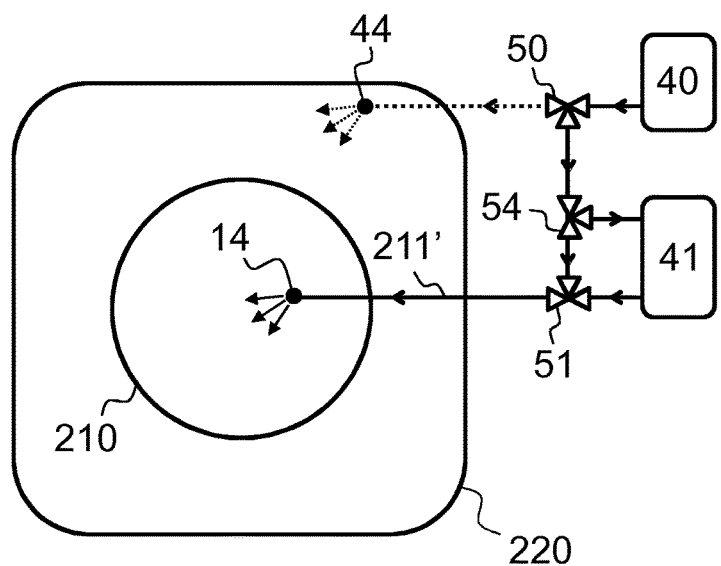
FIG. 6 shows a further example of sources and in-feed lines in a deposition apparatus.

FIG. 6 shows a further example of sources and in-feed lines in a deposition apparatus compatible with the method shown in FIG. 2. The apparatus may be of the type shown in FIGS. 3 and 4. The apparatus comprises a metal precursor source 41 and a second processing gas source 40. The second processing gas functions as inactive (shield) gas, carrier gas and second precursor gas (here: non-metal precursor) depending on the deposition cycle phase.

The second processing gas source 40 is in fluid communication with the input of an inactive gas line valve 50. A first output of valve 50 leads as a shield gas line into an intermediate space between an outer chamber 220 and a reaction chamber 210 of the apparatus. The second processing gas in the property of inactive shield gas is released to the intermediate space via a gas release point 44. A second output of valve 50 is in fluid communication with the input of a carrier gas input valve 54. A first output of valve 54 is in fluid communication with a carrier gas input of the metal precursor source 41. A second output of valve 54 is in fluid communication with a second input of a metal precursor line valve 51. The metal precursor source 41 is in fluid communication with a first input of valve 51. The output of valve 51 continues as a reaction chamber in-feed line 211' towards the reaction chamber 210. The gas/vapor flowing in the in-feed line 211' is released to the reaction chamber 210 via a gas release point 14.

During the activation phase, the first input of the metal precursor line valve 51 is closed. Accordingly, the metal precursor species does not flow into the reaction chamber 210. A route from the second processing gas source 40 to the reaction chamber 210 via in-feed line 211' is kept open allowing second processing gas in the property of non-metal precursor to flow into the reaction chamber 210. The route can be formed via valves 50, 54 and 51. The non-metal precursor species in the proximity of the substrate surface on the area which see the photon source 240 (i.e., which are not in the shade of the shader 250, if applied) is excited. Alternatively, the metal precursor species on the substrate surface is excited. In both alternatives the excitation enables the reaction between the adsorbed metal precursor species and the gas phase non-metal precursor species. As a result, the substrate surface on said area becomes saturated by the non-metal precursor species. If desired, it can be arranged by the shader 250, that the whole substrate surface or only part of it becomes saturated.

During the regeneration phase, the first input and the output of the metal precursor line valve 51 are open allowing the metal precursor species together with the second processing gas in the property of carrier gas to flow into the reaction chamber 210 via in-feed line 211'. The photon exposure is switched off by the shader 250, or by not sending photons in the embodiment that uses a flashing photon source. The metal precursor species reacts with the non-metal precursor species which were adsorbed to the surface in the activation period. As a result, the substrate surface becomes saturated by the metal precursor species on the area of the adsorbed non-metal precursor species.

The shield gas line is kept open or closed depending on implementation. In certain example embodiments, the shield gas line is kept open during the whole deposition cycle/sequence allowing second processing gas in the property of inactive shield gas to enter the intermediate space via the gas release point 44.

Figure 7:
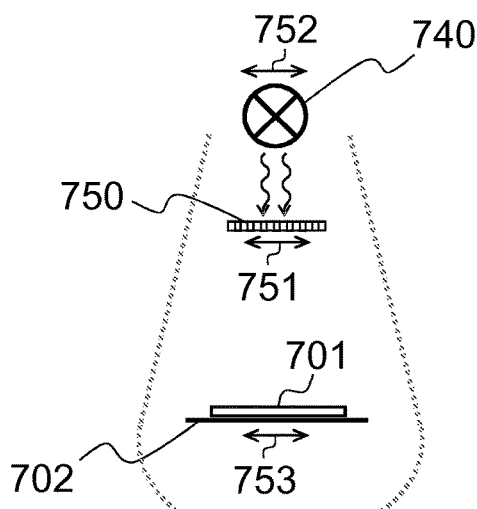
FIG. 7 shows different modulation methods in accordance with an example embodiment.

The alternation of the photon exposure and shade on the substrate surface is defined as modulation. The modulation can be effected in various ways. This is illustrated in FIG. 7 which shows different modulation methods. In a first method, a shader 750 is moved above the substrate surface as depicted by arrow 751. In a second method, the photon source 740 is moved as depicted by arrow 752. In a third method, the substrate 701 is moved as depicted by arrow 753. In the event of a substrate on a substrate holder 702, the substrate holder 702 can be moved. A further method is any combination of the first, second and third modulation method. In a yet further method, a flashing light/source is used alone or in combination with the other methods.

Figure 8:
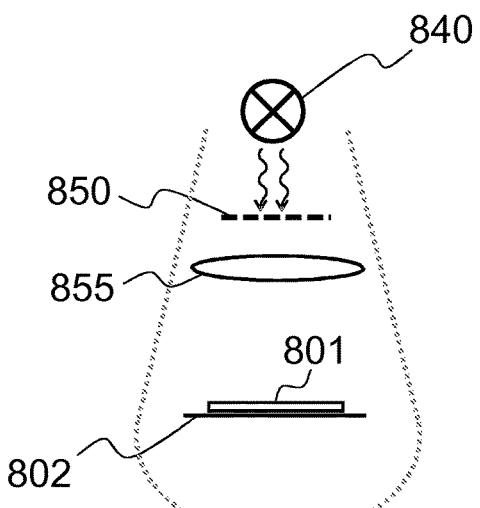
FIG. 8 shows a further example embodiment.

FIG. 8 shows a further example embodiment. The apparatus comprises a photon source 840 at a distance from a substrate 801 that is supported by a substrate holder 802. The apparatus comprises a patterned shader/mask 850 and a lens 855 between the photon source 840 and the substrate 801. The activation and regeneration periods are performed as in the foregoing embodiments. The growth occurs only at the areas on the substrate surface at which the pattern produced by the mask 850 is focused by the lens 855. In this way, the apparatus functions as an ALD printer. In a further example embodiment, the substrate 801 and/or the mask 850 is moved to achieve modulation as described in the foregoing.

In a yet further embodiment, selective deposition is achieved with a focused or well-defined light source, such as a laser source. In such an embodiment, the shader/mask 250 (750, 850) can be omitted, if desired, and a laser source is provided in the place of the photon source 240. Otherwise the growth method is similar to the method described in the foregoing. Accordingly, the laser source is configured to provide photon exposure on a (well-defined) selected area. The laser source may emit for example a laser pulse (a laser beam). The photon exposure is provided to the selected area on the substrate surface which see the laser, and accordingly the growth on the activation period occurs only on said selected area. The regeneration period will follow. The laser beam can be shifted if growth is required in other areas. When the laser beam is shifted further growth will then occur on the new area which see the beam. The embodiment can be implemented with or without a shader.

Figure 9:
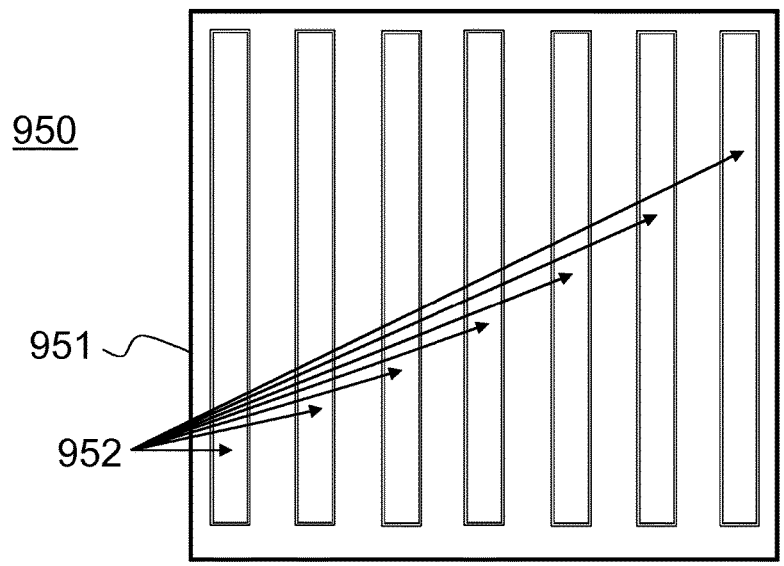
FIG. 9 shows an example shader in accordance with an example embodiment.

FIG. 9 shows an example shader (or shader grid) in accordance with an example embodiment. The shader 950 comprises a shader frame 951 with solid portions through which the emitted photons cannot penetrate and windows 952 through which the emitted photons can penetrate. The form of the windows 952 depends on the implementation. The windows 952 may be formed by glass or other material through which the photons can penetrate.

Figure 10:
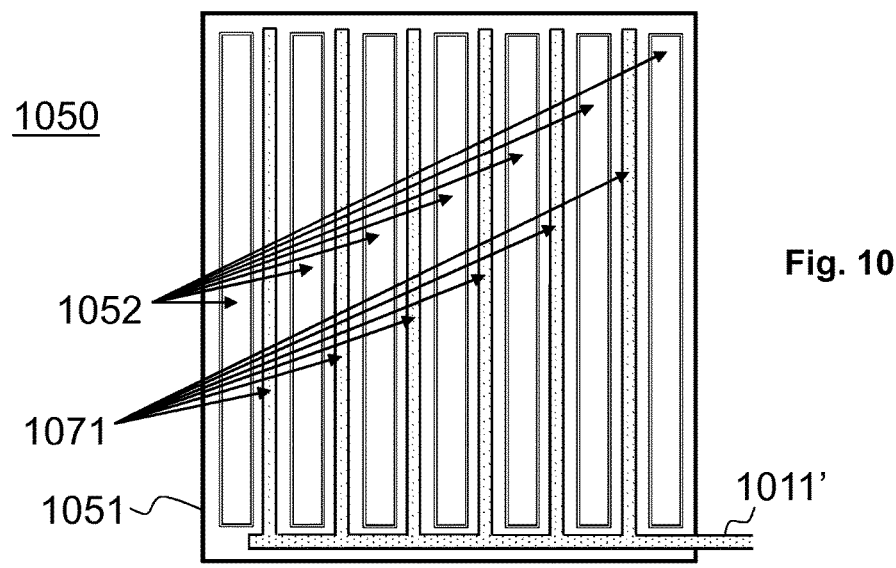
FIG. 10 shows an example shader nozzle in accordance with an example embodiment.

FIG. 10 further shows an example shader nozzle in accordance with an example embodiment. The shader nozzle 1050 can be used both as a shader and as a precursor in-feed nozzle in a reaction chamber. It can be placed above a substrate in between the substrate and a photon source. The shader nozzle 1050 comprises a shader frame 1051 with solid portions through which the emitted photons cannot penetrate and windows 1052 through which the emitted photons can penetrate. The form of the windows 1052 depends on the implementation. A precursor in-feed line 1011' is attached to the shader nozzle 1050. The in-feed line 1011' branches to individual lateral flow channels 1071 which extend throughout the shader frame 1051 along the solid portions. The flow channels 1071 have a plurality of apertures (not shown) on their lower surface to guide precursor vapor and/or other processing gas downwards towards the substrate surface.

Figure 11:
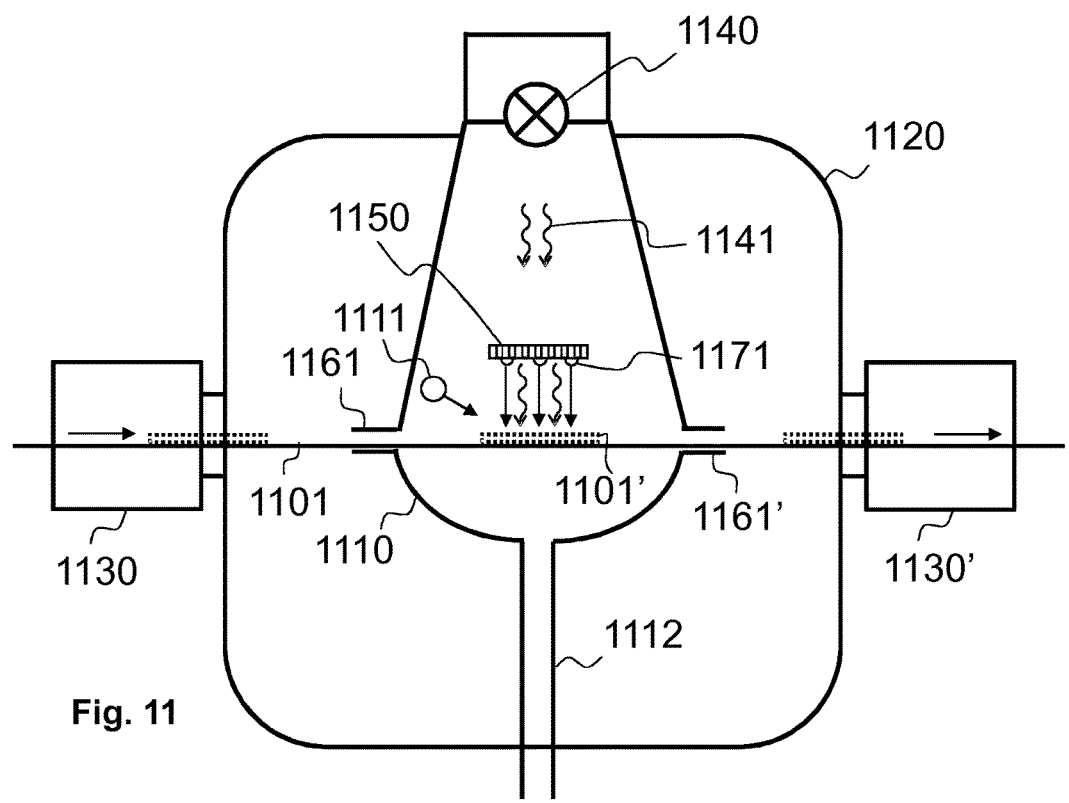
FIG. 11 shows a side view of an example apparatus in accordance with another example embodiment.

FIG. 11 shows a side view of an example apparatus in accordance with another embodiment. The apparatus is a processing apparatus or atomic layer deposition module suitable for continuous deposition as a part of a processing line.

The apparatus comprises a reaction chamber 1110 which is surrounded by an outer chamber 1120. An intermediate space between the outer chamber 1120 and the reaction chamber 1110 is pressurized by conveying inactive shield gas to the space so that there is a slight overpressure compared to the interior of the reaction chamber 1110.

A first transfer chamber 1130 is attached to a side of the outer chamber 1120, and a second transfer chamber 1130' is attached to an opposite side of the outer chamber 1120. The reaction chamber 1110 positioned within the outer chamber comprises an input port 1161 on its first side and an output port 1161' on an opposite side. The input port 1161 and the output port 1161' may be formed as a slit in a respective reaction chamber wall.

A substrate web 1101 to be coated is driven continuously through the first transfer chamber 1130 into the outer chamber 1120, therefrom through the input port 1161 into the reaction chamber 1110 for deposition, and therefrom through the output port 1161' into an opposite part of the outer chamber 1120, and through the second transfer chamber 1130' to a subsequent phase of the processing line. In an alternative embodiment, the substrate web 1101 is a web supporting a set of substrates 1101' (to be coated) travelling on it. In yet an alternative embodiment, the substrate is a strand or a strip.

The apparatus comprises a non-metal precursor in-feed line to convey non-metal precursor vapor to the reaction chamber 1110. A release point 1111 of non-metal precursor vapor is arranged on a side of the reaction chamber. The apparatus further comprises a metal precursor in-feed line to convey metal precursor vapor to the reaction chamber 1110. In FIG. 11, the metal precursor in-feed line is attached to a shader nozzle 1150 of the type described in the foregoing with reference to FIG. 10. The shader nozzle 1150 comprises laterally spreading flow channels 1171 which have a plurality of apertures on their lower surface to guide metal precursor vapor downwards towards the substrate surface.

The apparatus comprises a photon source 1140 above the substrate surface to provide photon exposure. The shader nozzle 1150 is applied between the photon source 1140 and the substrate surface. The shader nozzle 1150 comprises one or more windows through which the emitted photons 1141 can pass. The form and size of the window(s) depend on the implementation. The photon exposure is provided to the areas on the substrate surface which see the photon source 1140 behind the shader nozzle 1150. The shader nozzle 1150 can be movable.

The apparatus further comprises a vacuum pump (not shown) in an evacuation line 1112 for maintaining an outgoing flow from the reaction chamber 1110.

The apparatus comprises an inactive gas source, a metal precursor source and a non-metal precursor source. The sources are not shown in FIG. 9. However, a corresponding arrangement with regard to valves etc. as described in the foregoing with reference to FIG. 5 can be implemented.

Alternatively, if the apparatus operates in accordance with the method described with reference to FIG. 2, the apparatus comprises the metal precursor source and a second processing gas source. A corresponding arrangement with regard to valves etc. as described in the foregoing with reference to FIG. 6 can be implemented. The gas release point 1111 as well as the related in-feed line can be omitted in this alternative, if both precursors are fed via the shader nozzle 1150.

When the substrate 1101 or 1101' moves forward different areas of the substrate see the photon source 1140. An atomic layer deposition cycle described in the foregoing with reference to FIGS. 1 and 5 (alternatively FIGS. 2 and 6) is performed. Accordingly, during an activation phase, the metal precursor species is prevented from flowing into the reaction chamber 1110. The metal precursor input of metal precursor line valve (FIGS. 5 and 6; first input of valve 51) is closed. The non-metal precursor species is allowed to flow into the reaction chamber 1110. The non-metal precursor line in open (FIG. 5; the non-metal precursor line valve 52 is open) or a route from the second processing gas source (FIG. 6; route via valves 50, 54 and 51) in the alternative embodiment is open.

The non-metal precursor species in the proximity of the substrate surface on the areas which see the photon source 1140 (i.e., which are not in the shade of the shader nozzle 1150) is excited. Alternatively, the metal precursor species on the substrate surface is excited. In both alternatives the excitation enables the reaction between the adsorbed metal precursor species and the gas phase non-metal precursor species. As a result, the substrate surface on said areas becomes saturated by the non-metal precursor species.

During a regeneration phase, the metal precursor in-feed line is open allowing the metal precursor species to flow into the reaction chamber via the shader nozzle 1150. Furthermore, the non-metal precursor is also fed into the reaction chamber 1110 via the non-metal precursor in-feed line (or in the alternative embodiment as carrier gas via the shader nozzle 1150). The metal precursor species reacts with the non-metal precursor species which were adsorbed to the surface in the activation period. As a result, the substrate surface becomes saturated by the metal precursor species on the area of the adsorbed non-metal precursor species.

These deposition cycles are repeated to achieve a desired thickness. Conventional purge periods can be skipped.

The features of the embodiments described with reference to FIGS. 1-10 can be applied to the continuous deposition embodiment of FIG. 11 in which the substrate or substrate web was coated on its way through the reaction chamber. For example, instead of using the shader nozzle, a shader without gas in-feed functionality can be used. In those embodiments, the gas in-feed onto the substrate can be from the side. Furthermore, the continuous deposition embodiment can be performed, for example, without any shader using a flashing photon source as described in the foregoing, or with a shader and a flashing photon source. Furthermore, the features of the continuous deposition embodiment can be used in the embodiments presented previously in the description. For example, the shader nozzle can be used in the other presented embodiments. Certain example embodiments are implemented without including any transfer chamber(s) for loading and/or unloading. Furthermore, certain example embodiments are implemented without including an outer chamber around the reaction chamber. The track formed by the substrate or support web in the continuous deposition embodiment need not be straight, but a track formed in the form of a repeated pattern can be implemented. The direction of propagation of the web can be turned, for example by rolls, a plurality of times to form said repeated pattern. Furthermore, the reaction chamber form can deviate from the example form presented in the Figures. In one continuous deposition embodiment, the web moves continuously at constant speed. In certain other embodiments, the web is periodically moved (e.g., in a stop and go fashion) through the reaction chamber.

In accordance with certain example embodiments, the precursor vapor and inactive gas in-feed lines of the apparatuses described in the preceding are implemented by the required pipings and their controlling elements.

The in-feed line controlling elements comprise flow and timing controlling elements. In an example embodiment, a metal precursor in-feed valve and mass (or volume) flow controller in a metal precursor in-feed line control the timing and flow of metal precursor vapor into the reaction chamber. Correspondingly, a non-metal precursor in-feed valve and mass (or volume) flow controller in the non-metal precursor in-feed line control the timing and flow of the non-metal precursor vapor into the reaction chamber. Finally, an inactive gas line valve and mass (or volume) flow controller control the timing and flow of inactive gas. In an example in which inactive gas is used as carrier gas, there may different controlling elements as shown with reference to FIG. 6.

Figure 12:
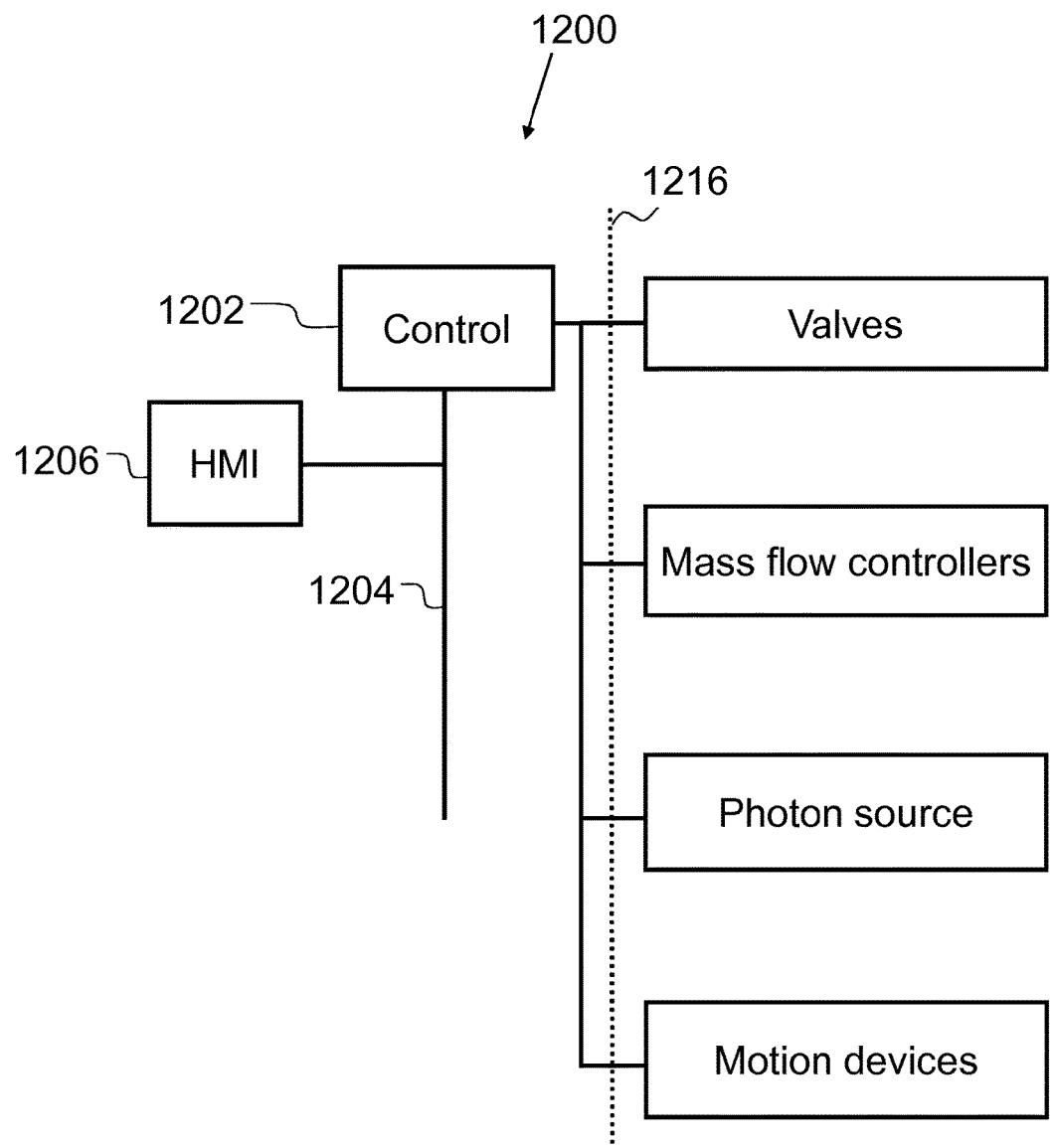
FIG. 12 shows a rough block diagram of a deposition apparatus control system in accordance with an example embodiment.

In an example embodiment, the in-feed line controlling elements form part of a computer controlled system. A computer program stored into a memory of the system comprises instructions, which upon execution by at least one processor of the system cause the coating apparatus, or deposition reactor, to operate as instructed. The instructions may be in the form of computer-readable program code. FIG. 12 shows a rough block diagram of a deposition apparatus control system 1200 in accordance with an example embodiment. In a basic system setup process parameters are programmed with the aid of software and instructions are executed with a human machine interface (HMI) terminal 1206 and downloaded via a communication bus 1204, such as Ethernet bus or similar, to a control box 1202 (control unit). In an embodiment, the control box 1202 comprises a general purpose programmable logic control (PLC) unit. The control box 1202 comprises at least one microprocessor for executing control box software comprising program code stored in a memory, dynamic and static memories, I/O modules, A/D and D/A converters and power relays. The control box 1202 sends electrical power to pneumatic controllers of appropriate valves, and controls mass flow controllers of the apparatus. The control box controls the operation of the photon source, and the vacuum pump. The control box further controls any motion devices needed to move either the substrate(s) and/or any movable shaders. The control box 1202 receives information from appropriate sensors, and generally controls the overall operation of the apparatus. In certain example embodiments, the control box 1202 controls the in-feed of precursor species into the reaction chamber such that both metal precursor species and non-metal species are present in gas phase in the reaction chamber simultaneously. The control box 1202 may measure and relay probe readings from the apparatus to the HMI terminal 1206. A dotted line 1216 indicates an interface line between reactor parts of the apparatus and the control box 1202.

Without limiting the scope and interpretation of the patent claims, certain technical effects of one or more of the example embodiments disclosed herein are listed in the following: A technical effect is a new type of a deposition cycle by which a faster atomic layer deposition rate can be achieved (fast atomic layer deposition). Another technical effect is lower required processing temperature due to photon exposure. Another technical effect is simplified chemical usage by using a second processing gas as both a precursor and carrier gas.

It should be noted the some of the functions or method steps discussed in the preceding may be performed in a different order and/or concurrently with each other. Furthermore, one or more of the above-described functions or method steps may be optional or may be combined.

In the context of this application, the term ALD comprises all applicable ALD based techniques and any equivalent or closely related technologies, such as, for example MLD (Molecular Layer Deposition) technique.

The foregoing description has provided by way of non-limiting examples of particular implementations and embodiments of the invention a full and informative description of the best mode presently contemplated by the inventors for carrying out the disclosed embodiments. It is however clear to a person skilled in the art that the disclosed embodiments are not restricted to details of the embodiments presented above, but that it can be implemented in other embodiments using equivalent means without deviating from the characteristics of the disclosed embodiments. It is to be noted that a metal precursor species has been used as an example for the first precursor species, and a non-metal precursor species as an example for the second precursor species. However, this must not be considered limiting. The first precursor can alternatively be a non-metal precursor. Both precursors can be, for example, non-metal precursors, etc. The choice of precursors is only dependent on the particular implementation and/or the desired coating material.

Furthermore, some of the features of the above-disclosed embodiments may be used to advantage without the corresponding use of other features. As such, the foregoing description should be considered as merely illustrative of the principles of the disclosed embodiments, and not in limitation thereof. Hence, the scope of the disclosed embodiments is only restricted by the appended patent claims.

The invention claimed is:

1. A method, comprising:
    performing an atomic layer deposition sequence comprising at least one deposition cycle, each cycle producing a monolayer of deposited material, the deposition cycle comprising introducing at least a first precursor species and a second precursor species to a substrate surface in a reaction chamber, wherein both of said first and second precursor species are present in gas phase in said reaction chamber simultaneously, the deposition cycle comprising an activation period and a regeneration period, and in the method:
    during the activation period, the first precursor species adsorbed to the substrate surface in a preceding regeneration period is excited by photon energy, whereby the adsorbed first precursor species reacts on the surface with the second precursor species which is in gas phase; and
    during a subsequent regeneration period, the first precursor species which is in gas phase reacts with the second precursor species adsorbed to the surface in the activation period.

2. The method of claim 1, wherein the reactions are sequential self-saturating surface reactions.

3. The method of claim 1, wherein the first precursor is a metal precursor and the second precursor a non-metal precursor.

4. The method of claim 1, wherein the deposition cycles are performed without performing purge periods.

5. The method of claim 1, comprising using the second precursor species as carrier gas for the first precursor gas.

6. The method of claim 1, comprising implementing the excitation by photons emitted by a photon source which is selected from a group consisting of: an UV lamp, a LED lamp, a xenon lamp, an X-ray source, a laser source, and an infrared source.

7. The method of claim 1, comprising selecting the substrate from a group consisting of:
    a wafer, metal foil, substrate web, paper, and nanocellulose.

8. The method of claim 1, comprising exciting the first precursor species by adjusting the wavelength of the photons.

9. The method of claim 1, the method comprising switching off photon exposure by a shader or shader nozzle.

10. The method of claim 1, the reaction chamber being surrounded by an outer chamber, the method comprising: pressurizing an intermediate space between the outer chamber and the reaction chamber by conveying inactive gas to the intermediate space so that there is an overpressure in the intermediate space compared to the pressure in an interior of the reaction chamber.

11. The method of claim 1, comprising the flow of the first precursor species to the reaction chamber being off during the activation period and being on during the regeneration periods, and the flow of the second precursor species to the reaction chamber being on during both the activation period and the regeneration period.

12. An apparatus, comprising:
    a reaction chamber;
    at least one in-feed line; and
    a control system having a control unit programmed to control the apparatus to perform an atomic layer deposition sequence comprising at least one deposition cycle in the reaction chamber, each cycle producing a monolayer of deposited material, the deposition cycle comprising introducing at least a first precursor species and a second precursor species via said at least one in-feed line to a substrate surface in the reaction chamber,
    the control system being further configured to control that precursor vapor both of said first and second precursor species is present in gas phase in said reaction chamber simultaneously, and the deposition cycle comprising an activation period and a regeneration period, and the apparatus comprising a photon source to excite, during the activation period by photon energy, the first precursor species adsorbed to the substrate surface in a preceding regeneration period whereby the adsorbed first precursor species reacts on the surface with the second precursor species which is in gas phase, the apparatus being further configured to cause:
        during a subsequent regeneration period, the first precursor species which is in gas phase to react with the second precursor species adsorbed to the surface in the activation period.

13. The apparatus of claim 12, wherein the reactions are sequential self-saturating surface reactions.

14. The apparatus of claim 12, wherein the first precursor is a metal precursor and the second precursor a non-metal precursor.

15. The apparatus of claim 12, wherein the control system is configured control that the deposition cycles are performed without performing purge periods.

16. The apparatus of claim 12, comprising a shader nozzle placed above the substrate in between the substrate and the photon source used both as a shader and as a precursor in-feed nozzle in the reaction chamber.

* * * * *